Feb. 23, 1971 J. C. McDONALD 3,566,312

SWITCHABLE FILTER NETWORK

Filed May 25, 1967

INVENTOR.
JOHN C. McDONALD
BY
Fleher, Hohbach, Test, Albritton & Herbert
ATTORNEYS United States Patent Office 3,566,312
Patented Feb. 23, 1971

3,566,312
SWITCHABLE FILTER NETWORK

John C. McDonald, Los Altos, Calif., assignor to Vidar Corporation, Mountain View, Calif., a corporation of California Filed May 25, 1967, Ser. No. 641,254
Int. Cl. H03h 7/10
U.S. Cl. 333—70 4 Claims

ABSTRACT OF THE DISCLOSURE

A filter switchable between Thomson and Butterworth characteristics where two of the inductors of the filter are maintained constant and the switching is accomplished by changing the values of three capacitors and the load resistance. The inductor dissipation factor is used as a common parameter and its value adjusted to cause the inductor ratios between the two characteristics to be equal. Thereafter by application of this ratio as an impedance scaling factor to the Butterworth characteristics, the inductor values are equalized necessitating only a change in the capacitor values and the load resistance value to switch between the two characteristics.

The present invention is directed to a filter network switchable between two predetermined transfer functions while maintaining at least two components at the same effective value.

In the processing of certain data it is often necessary to change the characteristics or response of a filter in the processing chain in order to accommodate different types of data inputs. For example, a change may be necessary between a maximally flat amplitiude response and a maximally flat delay response; these are termed a Butterworth and Thompson response respectively.

An obvious technique of changing filter response is to remove one filter and insert another in the circuit; this requires, of course, twice the number of components. A compromise filter may also be provided by switching only some of the components. The latter has been done in the case of Butterworth to Thomson filter but only at a sacrifice of a uniform bandwidth for both filter responses.

It is a general object of the present invention to provide an improved filter which is switchable between two predetermined responses or transfer functions.

It is another object of the invention to provide a filter as above in which at least two components are maintained at the same value for both transfer functions.

It is another object of the invention to provide a switchable filter which is inexpensive and yet requires no compromise in performance.

Accordingly, there is provided a filter network of the above type in which the components of the filter network to produce a first transfer function includes $A_1$, $B_1$ and $D_1$. The components of the network to produce the second transfer function includes $rA_2$, $rB_2$ and $rD_2$ where $r$ is an impedance scaling factor. The two transfer functions are related by a common parameter on which the component values of the network are dependent, the parameter having a predetermined specific value such that the following equation is fulfilled:

$$\frac{A_1}{A_2}=\frac{B_1}{B_2}$$

and where $$r=\frac{A_1}{A_2}$$

Thus the two components of the network which are maintained at the same value are $A_1$ and $B_1$ which are identical $rA_2$ and $rB_2$, respectively. The network includes means for switching from the first transfer function to the second transfer function by effectively substituting the component $rD_2$ from the component $D_1$.

These and other objects of the invention will be apparent from the following description.

Referring to the drawing.

Figure 1:
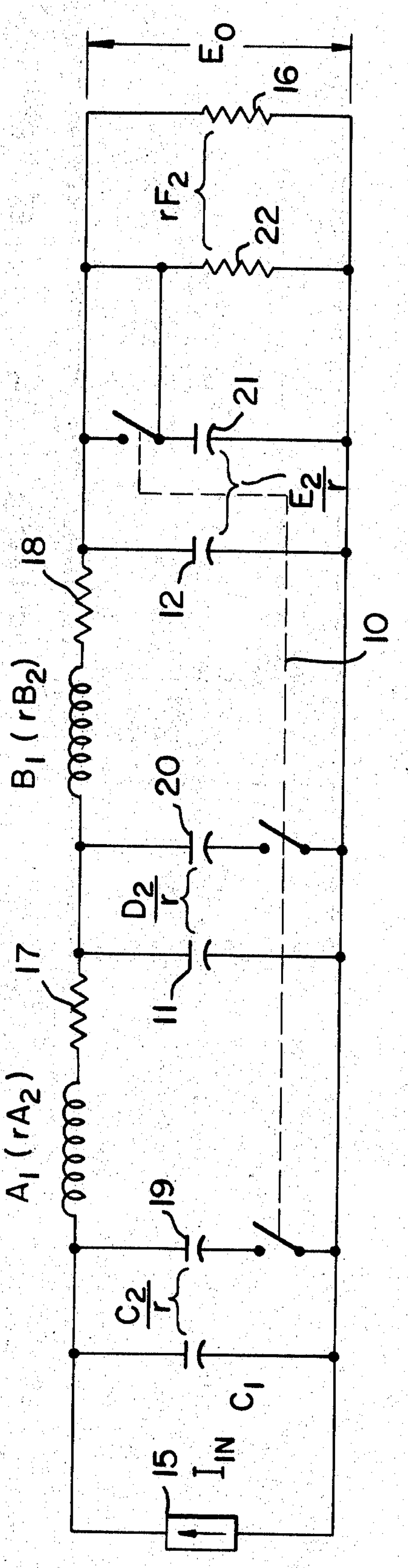
FIG. 1 is a circuit schematic of a filter embodying the present invention.
Figure 2:
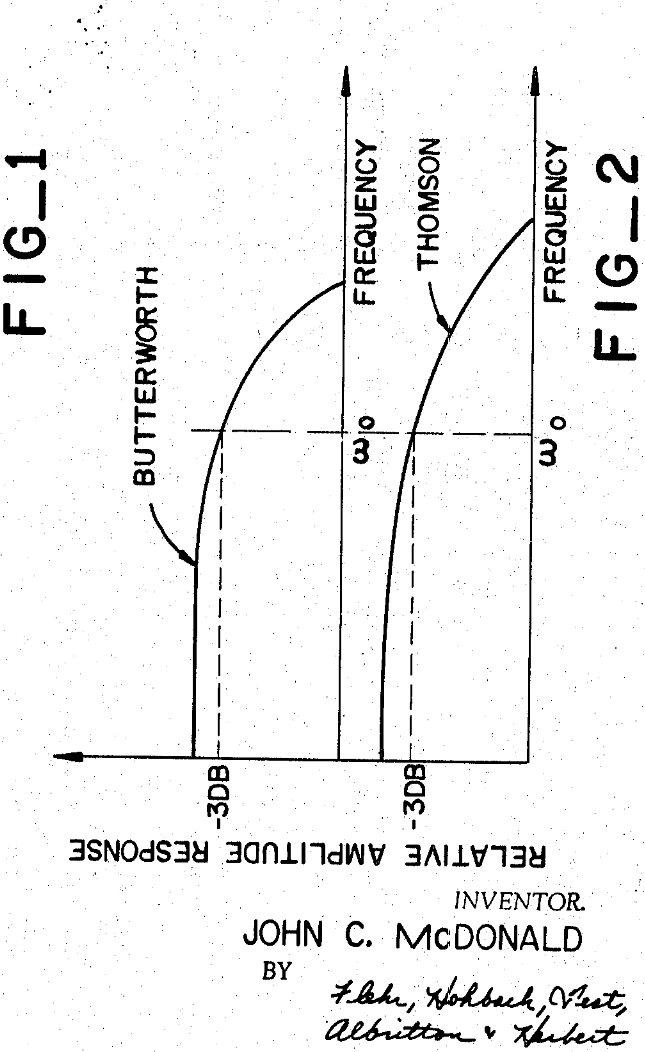
FIG. 2 shows filter response curves useful in understanding the invention.

The ladder type filter of FIG. 1 is switchable between a first transfer characteristic which is of the Thomson type and a second transfer characteristic which is of the Butterworth type as shown in FIG. 2. The transfer function for the circuit is defined as the ratio of output voltage, $E_0$, to input current, $I_{in}$. In the present embodiment, the filter is designed to operate from a current source 15 with infinite source impedance and is terminated in the load resistances shown. Ganged switches 10 provide the switching capability as will be explained in detail below. With switches 10 open, the filter is of the Thomson type with series inductive components $A_1$ and $B_1$ and shunt capacitive components $C_1$, 11 and 12. The output impedance of the network is provided by a shunt connected resistor 16. In series with inductors $A_1$ and $B_1$ are resistors 17 and 18, respectively. These represent both the internal resistance of the inductors themselves and any externally supplied resistance. Normally, of course, all inductors have some loss.

To switch the filter to a Butterworth type characteristic or transfer function, capacitors 19, 20 and 21 are provided in parallel with existing capacitors $C_1$, 11 and 12, respectively by closing ganged switches 10; in addition, the output impedance of the network is changed by inserting a resistor 22 in parallel with the existing resistor 16. Thus, in essence, three new capacitance values have been substituted along with a new load resistance value by the above parallel combination. Capacitors $C_1$ and 19 now form a combined capacitance designated, $C_2/r$. In addition, the inductors for the Butterworth transfer function are designated by the bracketed amounts of ($rA_2$) and ($rB_2$) which correspond to and are identical with inductors $A_1$ and $B_1$.

The parallel combination of capacitors 11 and 20 is designated as $D_2,/r$ of capacitors 12 and 21 as $E_2/r$ and of resistors 16 and 22 as $rF_2$.

With the switchable filter of the present invention, a change from one desired transfer function to another is shown in FIG. 2 is accomplished while maintaining all desired characteristics of the functions. For example, as illustrated, both curves have their half power point at $\omega_0$ to thus provide identical bandwidths. In addition, switching of the expensive inductors is not required.

Theory of construction

The switchable filter of FIG. 1 as now described may be thought of as a first filter of one transfer function having the "one" subscript components, along with capacitors 11 and 12 and resistor 16 and a filter of a second transfer function having the "two" subscript components which include $A_2$ through $F_2$. Each of these filter transfer functions may be related to a common parameter such as the inductor dissipation factor which is the reciprocal of the inductor "Q." More specifically, the dissipation factor, $d$, is given by the following equation:

$$d=\frac{1}{Q}=\frac{R}{\omega_o L}$$

where L is the value of inductors $A_1$, $B_1$ or $rA_2$, $rB_2$; R is the value of resistors 17 and 18, respectively, and $\omega_0$ is the frequency in question which would normally be the half power point or −3 db frequency, as illustrated in FIG. 2. Thus, to maintain a common dissipation factor the value of the resistance associated with each of the two inductors must be adjusted to give the single value.

Thus the filter for the Butterworth characteristic is dependent on the parameter $d$ in accordance with the following equations assuming the cutoff or half power frequency is normalized at $\omega_0=1$ with a load impedance of 1 ohm:

$$E_2=\frac{1}{b_4}$$

$$B_2=\frac{b_4}{b_3-\frac{b_2}{b_4}}$$

$$D_2=\frac{1}{B_2\left[\frac{b_2}{b_4}-E_2B_2(b_1-E_2)\right]}$$

$$A_2=\frac{1}{E_2D_2B_2[b_1-(D_2+E_2)]}$$

$$C_2=\frac{1}{E_2D_2A_2B_2}$$

$$R_{17}=drA_2\omega_0$$
$$R_{18}=drB_2\omega_0$$

where $b_4=3.2361-2d$
$b_3=5.2361-6.4722d+3d^2$
$b_2=5.2361-5.2361d+3.2361d^2-d^3$
$b_1=3.2361-5.2361d+5.2361d^2-3.2361d^3+d^4$ Similarly, for the Thomson characteristic, the following equations apply:

$$C_{12}=\frac{.62}{b_4}$$

$$B_1=\frac{.62b_4}{b_3-\frac{b_2}{b_4}}$$

$$C_{11}=\frac{.62}{\frac{B_1}{.62}\left[\frac{b_2}{b_4}-\frac{C_{12}B_1}{.3844}\left(b_1-\frac{C_{12}}{.62}\right)\right]}$$

$$A_1=\frac{.62}{\frac{C_{12}C_{11}B_1}{.2383}\left[b_1-\left(\frac{C_{12}}{.62}+\frac{C_{11}}{.62}\right)\right]}$$

$$C_1=\frac{.62}{\frac{C_{12}C_{11}A_1B_1}{.1477}}$$

$$R_{17}=dA_1\omega_0$$
$$R_{18}=dB_1\omega_0$$

where $b_4=3.881-2(.62d)$
$b_3=6.778-7.762(.62d)+3(.62d)^2$
$b_2=6.888-6.778(.62d)+3.881(.62d)^2-(.62d)^3$
$b_1=3.936-6.888(.62d)+6.778(.62d)^2-3.881(.62d)^3+(.62d)^4$ The $r$ factor in all of the component values for the Butterworth characteristic have been omitted since this is an impedance scaling factor to make $A_1$ equal to $rA_2$ and $B_1$ equal to $rB_2$.

In order to maintain the inductive components of the filter at the same value while switching from one characteristic to another, it is necessary that the following relationship obtain:

$$\frac{A_1}{A_2}=\frac{B_1}{B_2}$$

Than if $$r=\frac{A_1}{A_2}$$

where $r$ is an impedance scaling factor applied to all components, the inductors and the associated resistors of the circuit can remain of the same value.

In other words, by adjustment of the inductor dissipation factor, $d$, to achieve the above equality of component ratios, the desired Butterworth type characteristic is designed with the resulting components $A_2$, $B_2$, $C_2$, $D_2$, $E_2$ and $F_2$. By the use of impedance scaling, where an identical response will be obtained if every component is scaled by the same ratio, the inductor and load resistor values can all be multiplied by the r ratio factor and the capacitors divided by the $r$ ratio factor to produce a filter of the Butterworth characteristic and to also cause $rA_2$ to equal $A_1$ and $rB_2$ to equal $B_1$. Thus the filter may be switched between characteristics by changing only the values of the three capacitors and the load resistance.

In order to obtain this necessary equality of ratios for the two components which are to be maintained at the same value, a common parameter, such as the "$d$" factor, must be found in both sets of relationships upon which the component values of the specific transfer functions are dependent. Because of the complicated nature of this relationship as illustrated above, a computer solution is desirable.

In summary it should be emphasized that one of the crucial factors in the present invention is the realization that by utilization of a "lossy L" design, where the dissipation factor affects the design of the filter, that this common parameter may be varied to equalize the ratios of two of the components. It should also be realized that the equalization of ratios may be achieved by the use of some other common parameter, such as the situation where a uniform dissipation occurs between the inductance and capacitance. In this modification, of course, the dissipation factor must be the same for both transfer functions to maintain the necessary equality of the ratios.

Moreover, the present invention is not limited to maintaining only two inductors or components constant; in some cases it may be possible to maintain three or more components constant depending on the complexity of the relationship of the common parameter with the various values of the filter network and these components may include others besides the inductors, such as a capacitor. Finally, of course, the invention is not limited to the specific type of filter network as shown nor to switching between Thomson and Butterworth filter characteristics.

The invention, as disclosed in the preferred embodiment of FIG. 1, has been constructed to switch between the Butterworth and Thomson characteristics while maintaining the same bandwidth of $\omega_0$, which is the −3 db point of the characteristics (FIG. 2). The following component values were used with inductors in henries, resistors in ohms, and capacitors in microfarads and with the frequency, $\omega_0$, normalized to $2\pi$ radians:

| | |
|---|---|
| Inductors: | |
| $A_1$ ($rA_2$) | 433.1 |
| $B_1$ ($rB_2$) | 181.0 |
| Resistors: | |
| 17 | 584.7 |
| 18 | 244.4 |
| 16 | 2.09K |
| 22 | 1.91K |
| Capacitors: | |
| $C_1$ | 79.82 |
| 19 | 38.12 |
| 11 | 54.80 |
| 20 | 140.2 |
| 12 | 13.06 |
| 21 | 43.67 |

With the above values the ratio $r$ or impedance scaling factor is 2.09. The dissipation factor "$d$" for the equality of the ratios $A_1$, $A_2$ and $B_1$, $B_2$ is .2150.

Thus the present invention has provided a filter which, while maintaining two components constant in value, provides for switching between two predetermined characteristics.

What is claimed is:

1. In a filter network switchable between two predetermined transfer functions while maintaining at least two components of the network at the same effective component value, the components of said network to produce said transfer function having values of $A_1$, $B_1$ and $D_1$, the components of said network to produce said second transfer function having values of $rA_2$, $rB_2$ and $rD_2$, where $r$ is an impedance scaling factor not equal to one, said two transfer functions being related by a common parameter on which the component values of said two components of said network are dependent, said parameter being the dissipation factor of said network having a predetermined specific value such that $$\frac{A_1}{A_2}=\frac{B_1}{B_2}$$

and where $$r=\frac{A_1}{A_2}$$

whereby said two components of the network which are maintained at the same value have values $A_1$ and $B_1$ which are identical to values $rA_2$ and $rB_2$, respectively, said network including means for switching from said first transfer function to said second transfer function by effectively substituting said component value $rD_2$ for said component value, $D_1$, said filter components including resistors and inductors and said dissipation factor is determined by the ratio of the resistor-inductor values.

2. A filter network switchable between a first transfer function of the Thomson type and a second transfer function of the Butterworth type while maintaining at least two components of the network at the same effective component value, the components of said network to produce said first transfer function having values of $A_1$, $B_1$ and $D_1$, the components of said network to produce said second transfer function having values of $rA_2$, $rB_2$ and $rD_2$, where $r$ is an impedance scaling factor not equal to one, said two transfer functions being related by a common parameter on which the component values of said two components of said network are dependent, said parameter having a predetermined specific value such that $$\frac{A_1}{A_2}=\frac{B_1}{B_2}$$

and where $$r=\frac{A_1}{A_2}$$

whereby said two components of the network which are maintained at the same value have values $A_1$ and $B_1$ which are identical to values $rA_2$ and $rB_2$, respectively, said network including means for switching from said first transfer function to said second transfer function by effectively substituting said component value $rD_2$ for said component value, $D_1$.

3. A filter as in claim 2 where said common parameter is the inductor dissipation factor and where said specific value is .2150.

4. A filter as in claim 2 where said scaling factor, $r$, is 2.09.

References Cited

UNITED STATES PATENTS

| | | | |
|---|---|---|---|
| 2,282,113 | 5/1942 | Brailsford | 333—77 |
| 2,161,593 | 6/1939 | Rust | 333—70 |
| 3,255,421 | 6/1966 | Skalski | 330—34 |
| 2,076,248 | 4/1937 | Norton | 333—70 |
| 3,110,004 | 11/1963 | Pope | 334—15 |
| 3,475,702 | 10/1969 | Ainsworth | 333—17 |
| 2,298,498 | 10/1942 | Moore | 333—76 |

HERMAN KARL SAALBACH, Primary Examiner

C. BARAFF, Assistant Examiner

U.S. Cl. X.R.

333—77